(12) United States Patent  (10) Patent No.: US 9,173,336 B2
Bhatia et al.  (45) Date of Patent: Oct. 27, 2015

(54) TECHNIQUES FOR MARKING PRODUCT HOUSINGS

(71) Applicant: Apple Inc., Cupertino, CA (US)

(72) Inventors: Rimple Bhatia, Woodside, CA (US); Paul Choiniere, Livermore, CA (US); Michael S. Nashner, San Jose, CA (US)

(73) Assignee: Apple Inc., Cupertino, CA (US)

( * ) Notice: Subject to any disclaimer, the term of this patent is extended or adjusted under 35 U.S.C. 154(b) by 45 days.

(21) Appl. No.: 13/901,350

(22) Filed: May 23, 2013

(65) Prior Publication Data

US 2013/0251915 A1  Sep. 26, 2013

Related U.S. Application Data

(63) Continuation-in-part of application No. 12/569,810, filed on Sep. 29, 2009.

(60) Provisional application No. 61/179,588, filed on May 19, 2009, provisional application No. 61/702,127, filed on Sep. 17, 2012.

(51) Int. Cl.
*H05K 13/00* (2006.01)
*H05K 5/02* (2006.01)
*G09F 3/00* (2006.01)
*G09F 7/16* (2006.01)
(Continued)

(52) U.S. Cl.
CPC .............. *H05K 13/0084* (2013.01); *G09F 3/00* (2013.01); *G09F 7/165* (2013.01); *H05K 5/0243* (2013.01); *B05D 1/32* (2013.01); *B05D 5/06* (2013.01); *B05D 7/53* (2013.01)

(58) Field of Classification Search
CPC ... H05K 13/0084; H05K 5/0243; G09K 3/00; G09K 7/165
USPC .................... 156/272.2, 272.8; 427/555, 558
See application file for complete search history.

(56) References Cited

U.S. PATENT DOCUMENTS 2,647,079 A   7/1953   Burnham
2,812,295 A  11/1957   Patrick
(Continued)

FOREIGN PATENT DOCUMENTS

CN   1362125 A   8/2002
CN   1306526 C   3/2007
(Continued)

OTHER PUBLICATIONS

"Thermal Shock Resistant Conformal Coating", Product Data Sheet, Dymax Corporation, Jul. 9, 2007, pp. 1-2.
(Continued)

*Primary Examiner* — Daniel McNally

(57) ABSTRACT

Techniques or processes for providing markings on products are disclosed. The markings provided on products can be textual and/or graphic. The techniques or processes can provide high resolution markings on surfaces that are flat or curved. In one embodiment, the products have housings and the markings are to be provided on the housings. For example, the housing for a particular product can include an outer housing surface and the markings can be provided on the outer housing surface. The markings can be formed using a ultra-violet (UV) curable material that can be selectively cured on a surface (e.g., housing surface) in places where markings, namely text and/or graphics, are to be provided.

23 Claims, 10 Drawing Sheets

(51) Int. Cl.
B05D 5/06 (2006.01)
B05D 7/00 (2006.01)
B05D 1/32 (2006.01)

(56) References Cited

U.S. PATENT DOCUMENTS

| | | | |
|---|---|---|---|
| 2,990,304 | A | 6/1961 | Cybriwsky et al. |
| 3,316,866 | A | 5/1967 | Shelton |
| 3,526,694 | A | 9/1970 | Lemelson |
| 3,615,432 | A | 10/1971 | Jenkins et al. |
| 3,645,777 | A | 2/1972 | Sierad |
| RE28,225 | E | 11/1974 | Heseltine et al. |
| 4,247,600 | A | 1/1981 | Adachi et al. |
| 4,269,947 | A | 5/1981 | Inata et al. |
| 4,347,428 | A | 8/1982 | Conrad et al. |
| 4,531,705 | A | 7/1985 | Nakagawa et al. |
| 4,547,649 | A | 10/1985 | Butt et al. |
| 4,564,001 | A | 1/1986 | Maeda |
| 4,651,453 | A | 3/1987 | Doyle |
| 4,686,352 | A | 8/1987 | Nawrot et al. |
| 4,754,418 | A * | 6/1988 | Hara .......... 361/679.56 |
| 4,756,771 | A | 7/1988 | Brodalla et al. |
| 4,931,366 | A | 6/1990 | Mullaney |
| 4,993,148 | A | 2/1991 | Adachi et al. |
| 5,215,864 | A | 6/1993 | Laakmann |
| 5,224,197 | A | 6/1993 | Zanoni et al. |
| 5,288,344 | A | 2/1994 | Peker et al. |
| 5,417,905 | A | 5/1995 | Lemaire et al. |
| 5,645,964 | A | 7/1997 | Nohr et al. |
| 5,719,379 | A | 2/1998 | Huang et al. |
| 5,744,270 | A | 4/1998 | Pearlman et al. |
| 5,789,466 | A | 8/1998 | Birmingham et al. |
| 5,808,268 | A | 9/1998 | Balz |
| 5,837,086 | A | 11/1998 | Leeb et al. |
| 5,872,699 | A | 2/1999 | Nishii et al. |
| 5,925,847 | A | 7/1999 | Rademacher et al. |
| 5,943,799 | A | 8/1999 | Xu et al. |
| 6,007,929 | A | 12/1999 | Robertson et al. |
| 6,052,062 | A * | 4/2000 | Tuttle .......... 340/5.64 |
| 6,101,372 | A | 8/2000 | Kubo |
| 6,165,696 | A * | 12/2000 | Fischer .......... 430/320 |
| 6,169,266 | B1 | 1/2001 | Hughes |
| 6,325,868 | B1 | 12/2001 | Kim et al. |
| 6,331,239 | B1 | 12/2001 | Shirota et al. |
| 6,480,397 | B1 | 11/2002 | Hsu et al. |
| 6,540,867 | B1 | 4/2003 | Cochran |
| 6,574,096 | B1 | 6/2003 | Difonzo et al. |
| 6,590,183 | B1 | 7/2003 | Yeo |
| 6,633,019 | B1 | 10/2003 | Gray |
| 6,746,724 | B1 | 6/2004 | Robertson et al. |
| 6,802,952 | B2 | 10/2004 | Hsu et al. |
| 6,821,305 | B2 | 11/2004 | Yan |
| 6,966,133 | B2 | 11/2005 | Krings et al. |
| 6,996,425 | B2 | 2/2006 | Watanabe |
| 7,065,820 | B2 | 6/2006 | Meschter |
| 7,134,198 | B2 | 11/2006 | Nakatani et al. |
| 7,181,172 | B2 | 2/2007 | Sullivan et al. |
| 7,225,529 | B2 | 6/2007 | Wang |
| 7,284,396 | B2 | 10/2007 | Barron et al. |
| 7,459,373 | B2 | 12/2008 | Yoo |
| 7,508,644 | B2 | 3/2009 | Cheung et al. |
| 7,622,183 | B2 | 11/2009 | Shirai et al. |
| 7,636,974 | B2 | 12/2009 | Meschter et al. |
| 7,691,189 | B2 | 4/2010 | En et al. |
| 8,192,815 | B2 | 6/2012 | Weber et al. |
| 8,367,304 | B2 | 2/2013 | Heley et al. |
| 8,379,678 | B2 | 2/2013 | Zhang et al. |
| 8,379,679 | B2 | 2/2013 | Zhang et al. |
| 8,451,873 | B2 | 5/2013 | Zhang |
| 8,663,806 | B2 | 3/2014 | Weber et al. |
| 8,879,266 | B2 | 11/2014 | Jarvis et al. |
| 2001/0030002 | A1 | 10/2001 | Zheng et al. |
| 2002/0058737 | A1 | 5/2002 | Nishiwaki et al. |
| 2002/0097440 | A1 | 7/2002 | Paricio et al. |
| 2002/0109134 | A1 | 8/2002 | Iwasaki et al. |
| 2002/0130441 | A1 | 9/2002 | Robinson et al. |
| 2002/0160145 | A1 | 10/2002 | Bauhoff |
| 2003/0006217 | A1 | 1/2003 | Dance |
| 2003/0024898 | A1 | 2/2003 | Natsume et al. |
| 2003/0074814 | A1 | 4/2003 | Krings et al. |
| 2004/0000490 | A1 | 1/2004 | Chang |
| 2005/0023022 | A1 | 2/2005 | Kriege et al. |
| 2005/0034301 | A1 | 2/2005 | Wang |
| 2005/0115840 | A1 | 6/2005 | Dolan |
| 2005/0127123 | A1 | 6/2005 | Smithers |
| 2005/0158576 | A1 | 7/2005 | Groll |
| 2005/0224169 | A1 * | 10/2005 | Flosbach et al. .......... 156/275.5 |
| 2005/0263418 | A1 | 12/2005 | Cortes |
| 2006/0055084 | A1 | 3/2006 | Yamaguchi et al. |
| 2006/0066771 | A1 | 3/2006 | Hayano et al. |
| 2006/0105542 | A1 | 5/2006 | Yoo |
| 2006/0225918 | A1 | 10/2006 | Chinda et al. |
| 2007/0018817 | A1 | 1/2007 | Marmaropoulos et al. |
| 2007/0045893 | A1 | 3/2007 | Asthana et al. |
| 2007/0053504 | A1 | 3/2007 | Sato et al. |
| 2007/0262062 | A1 | 11/2007 | Guth |
| 2007/0275263 | A1 | 11/2007 | Groll |
| 2008/0152859 | A1 | 6/2008 | Nagal |
| 2008/0165485 | A1 | 7/2008 | Zadesky et al. |
| 2008/0166007 | A1 | 7/2008 | Hankey |
| 2008/0241478 | A1 | 10/2008 | Costin et al. |
| 2008/0274375 | A1 | 11/2008 | Ng et al. |
| 2008/0295263 | A1 | 12/2008 | Meschter et al. |
| 2008/0299408 | A1 | 12/2008 | Guo et al. |
| 2008/0311369 | A1 | 12/2008 | Yokoyama et al. |
| 2009/0017242 | A1 | 1/2009 | Weber et al. |
| 2009/0019737 | A1 | 1/2009 | Moreno |
| 2009/0091879 | A1 | 4/2009 | Lim |
| 2009/0104949 | A1 | 4/2009 | Sato et al. |
| 2009/0190290 | A1 | 7/2009 | Lynch et al. |
| 2009/0194444 | A1 | 8/2009 | Jones |
| 2009/0197116 | A1 | 8/2009 | Cheng et al. |
| 2009/0236143 | A1 | 9/2009 | Nakamura |
| 2009/0260871 | A1 | 10/2009 | Weber et al. |
| 2009/0305168 | A1 | 12/2009 | Heley et al. |
| 2010/0015578 | A1 | 1/2010 | Falsafi et al. |
| 2010/0061039 | A1 | 3/2010 | Sanford et al. |
| 2010/0065313 | A1 | 3/2010 | Takeuchi et al. |
| 2010/0159273 | A1 | 6/2010 | Filson et al. |
| 2010/0183869 | A1 | 7/2010 | Lin et al. |
| 2010/0209721 | A1 | 8/2010 | Irikura et al. |
| 2010/0209731 | A1 | 8/2010 | Hamano |
| 2010/0294426 | A1 | 11/2010 | Nashner |
| 2010/0300909 | A1 | 12/2010 | Hung |
| 2011/0008618 | A1 | 1/2011 | Weedlun |
| 2011/0048755 | A1 | 3/2011 | Su et al. |
| 2011/0051337 | A1 | 3/2011 | Weber et al. |
| 2011/0089039 | A1 | 4/2011 | Nashner et al. |
| 2011/0089067 | A1 | 4/2011 | Scott et al. |
| 2011/0123737 | A1 | 5/2011 | Nashner et al. |
| 2011/0186455 | A1 | 8/2011 | Du et al. |
| 2011/0193928 | A1 | 8/2011 | Zhang et al. |
| 2011/0193929 | A1 | 8/2011 | Zhang et al. |
| 2011/0194574 | A1 | 8/2011 | Zhang et al. |
| 2011/0253411 | A1 | 10/2011 | Hum et al. |
| 2011/0315667 | A1 | 12/2011 | Reichenback et al. |
| 2012/0043306 | A1 | 2/2012 | Howerton et al. |
| 2012/0081830 | A1 | 4/2012 | Yeates et al. |
| 2012/0100348 | A1 | 4/2012 | Brookhyser et al. |
| 2012/0248001 | A1 | 10/2012 | Nashner |
| 2012/0275130 | A1 | 11/2012 | Hsu et al. |
| 2013/0075126 | A1 | 3/2013 | Nashner et al. |
| 2013/0083500 | A1 | 4/2013 | Prest et al. |
| 2013/0129986 | A1 | 5/2013 | Heley et al. |
| 2014/0009873 | A1 | 1/2014 | Nashner |
| 2014/0134429 | A1 | 5/2014 | Weber et al. |

FOREIGN PATENT DOCUMENTS

| | | |
|---|---|---|
| CN | 201044438 Y | 2/2008 |
| CN | 101204866 | 6/2008 |
| CN | 102173242 A | 9/2011 |
| DE | 195 23 112 | 6/1996 |
| DE | 102005048870 A1 | 4/2007 |

(56) References Cited

FOREIGN PATENT DOCUMENTS

| | | |
|---|---|---|
| EP | 0031463 | 7/1981 |
| EP | 0 114 565 A1 | 8/1984 |
| EP | 121150 A1 | 10/1984 |
| EP | 0234121 | 9/1987 |
| EP | 0 633 585 A | 1/1995 |
| EP | 0 997 958 A1 | 5/2000 |
| EP | 2 399 740 A1 | 12/2011 |
| EP | 2488369 B1 | 3/2014 |
| GB | 788 329 A | 12/1957 |
| JP | 57-149491 A | 9/1982 |
| JP | 03 013331 A | 1/1991 |
| JP | 03 138131 A | 6/1991 |
| JP | 3-203694 A | 9/1991 |
| JP | 06-126192 | 5/1994 |
| JP | A H06-212451 | 8/1994 |
| JP | 06-320104 | 11/1994 |
| JP | 7-204871 A | 8/1995 |
| JP | 2000-000167 | 1/2000 |
| JP | 2003055794 | 2/2003 |
| JP | A2006-138002 | 6/2006 |
| JP | 2008 087409 A | 4/2008 |
| WO | WO 98/53451 | 11/1998 |
| WO | WO 0077883 | 12/2000 |
| WO | WO 01/15916 A1 | 3/2001 |
| WO | WO 01/34408 | 5/2001 |
| WO | WO 2006/124279 A2 | 11/2006 |
| WO | WO 2007/088233 A1 | 8/2007 |
| WO | WO 2008/092949 A1 | 8/2008 |
| WO | WO 2009/051218 A1 | 4/2009 |
| WO | WO 2010/095747 A1 | 8/2010 |
| WO | WO 2010/111798 A1 | 10/2010 |
| WO | WO2010/135415 A2 | 11/2010 |
| WO | WO 2011/047325 A1 | 4/2011 |

OTHER PUBLICATIONS

"Marking Lasers: Marking without Limitations", Trumpf Inc., Sep. 10, 2007, pp. 1-36.

"UV-Curing Sheet Adhesives", ThreeBond Technical News, Issued Jul. 1, 2009, 8 pages.

Chang, "Lasers Make Other Metals Look Like Gold", New York Times, nytimes.com, 2 pgs., Jan. 31, 2008.

"Database EPI" Week 201107 Thomas Scientific, London, GB; AN 2010-Q46184, Nov. 17, 2010, 1 pg.

"DP2UV Basic System 2 W", ROBA Technology + Services GmbH, Aug. 2008, 2 pgs.

Restriction Requirement for U.S. Appl. No. 12/569,810, mailed Dec. 9, 2011.

Office Action for U.S. Appl. No. 12/569,810, mailed Jun. 7, 2012.

Final Office Action for U.S. Appl. No. 12/569,810, mailed Dec. 24, 2012.

Office Action for U.S. Appl. No. 12/569,810, mailed Jun. 21, 2013.

Final Office Action for U.S. Appl. No. 12/569,810, mailed Mar. 7, 2014.

Pre-Appeal Decision for U.S. Appl. No. 12/569,810, mailed Jul. 15, 2014.

Answer Brief for U.S. Appl. No. 12/569,810, mailed Nov. 10, 2014.

\* cited by examiner

TECHNIQUES FOR MARKING PRODUCT HOUSINGS

CROSS-REFERENCE TO RELATED APPLICATIONS

This application is a Continuation-In-Part of U.S. application Ser. No. 12/569,810, filed Sep. 29, 2009 and entitled "TECHNIQUES FOR MARKING PRODUCT HOUSINGS," which is hereby incorporated herein by reference, which claims priority benefit of U.S. Provisional Application No. 61/179,588, filed May 19, 2009 and entitled "TECHNIQUES FOR MARKING PRODUCT HOUSINGS," which is hereby incorporated herein by reference.

This application also claims priority benefit of U.S. Provisional Application No. 61/702,127, filed Sep. 17, 2012 and entitled "TECHNIQUES FOR MARKING PRODUCT HOUSINGS," which is hereby incorporated herein by reference.

BACKGROUND OF THE INVENTION

1. Field of the Invention

The present invention relates to marking products and, more particularly, marking outer housing surfaces of electronic devices.

2. Description of the Related Art

Consumer products, such as electronic devices, have been marked with various information for many years. For example, it is common for electronic devices to be marked with a serial number, model number, copyright information and the like. Conventionally, such markings are done with an ink printing or stamping process. Although conventional ink printing and stamping is useful for many situations, such techniques can be inadequate in the case of handheld electronic devices. The small form factor of handheld electronic devices, such as mobile phones, portable media players and Personal Digital Assistants (PDAs), requires that the markings be very small. In order for such small markings to be legible, the markings must be accurately and precisely formed. Unfortunately, however, conventional techniques are not able to offer sufficient accuracy and precision. Thus, there is a need for improved techniques to mark products.

SUMMARY

The invention pertains to techniques or processes for providing markings on products. The markings provided on products can be textual and/or graphic. The techniques or processes can provide high resolution markings on surfaces that are flat or curved. In one embodiment, the products have housings and the markings are to be provided on the housings. For example, the housing for a particular product can include an outer housing surface and the markings can be provided on the outer housing surface. The products can, in one embodiment, pertain to electronic devices, such as portable electronic device (e.g., handheld electronic devices).

In one embodiment, a material (e.g., UV ink) can be configured to be specifically sensitive to UV radiation. In one example, the material can be sensitive to the UV radiation such that the material can be partially cured. Then, after being partially cured, the material that has not been partially cured can be cleaned from the surface. Subsequently, the remaining partially-cured material can be completely cured.

In another embodiment, a UV ink can be configured to be specifically sensitive to multiple different wavelengths of UV radiation. In one example, the UV ink can be configured to be sensitive to radiation, such as UV radiation, of a first wavelength and a second wavelength. For example, in a first pass, a UV laser applying UV radiation of a first wavelength can be used to cure selective portions of the UV ink, and then, in a second pass, a laser can apply radiation to ablate away undesired portions of the UV ink.

In still another embodiment, a marking material can be placed on a surface and configured to selected change color under laser control. The marking material, such as ink, can include one or more initiators. For example, the initiators can be dye additives. The one or more initiators in the marking material can serve as color activators. Laser energy can then be selectively applied to initiate colorization of the marking material. Different initiators can be receptive to different wavelength of laser energy such that different colors can be produced using different wavelengths. The colorization can be induced before, during or after cure of the marking material.

In general, markings, or annotations, provided on products according to the invention can be textual and/or graphic. The markings can be provided in one color or multiple colors. The marking of a product can be used to provide the product (e.g., a product's housing) with certain information. The marking can, for example, be use to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like. When a marking includes a graphic, the graphic can pertain to a logo, a certification mark, standards mark or an approval mark. The markings can be used for advertisements to be provided on products. The markings can also be used for customization (e.g., user customization) of product housings (e.g., customized external appearance via markings).

One aspect of some embodiments provides product markings using an ultra-violet (UV) curable material. Here, a UV curable material can be placed on a product surface, and then selectively cured on the product surface in places where markings, namely text and/or graphics, are to be provided. Subsequently, remaining UV curable material at the product surface that has not been cured can be removed such that the product surface thereafter includes the text and/or graphics for the product marking. The product marking process according to the invention is suitable for use on flat, curved or complex surfaces.

The invention can be implemented in numerous ways, including as a method, system, device, or apparatus. Several embodiments of the invention are discussed below.

As a method for depositing material to selected regions of an electronic device housing, one embodiment can, for example, include at least: depositing a layer of UV curable material onto a housing surface of the electronic device housing; curing select portions of the layer of UV curable material that are desired to remain on the outer surface housing; and removing remaining portions of the layer of UV curable material that have not been cured by said curing.

As a method for depositing material to selected regions of an electronic device housing, another embodiment can, for example, include at least: forming a mask layer having at least one predetermined opening; adhering the mask layer to a housing surface of the electronic device housing; depositing a layer of UV curable material onto the housing surface, the layer of UV curable material being provided on the housing surface at least within the predetermined opening of the mask layer; removing the mask layer from the outer surface housing; curing select portions of the layer of UV curable material that are desired to remain on the outer surface housing; and removing remaining portions of the layer of UV curable material that have not been cured by said curing.

As a method for depositing material to selected regions of an electronic device housing, another embodiment can, for example, include at least: depositing a layer of UV curable material onto a housing surface of the electronic device housing; and directing UV light from a UV laser onto select portions of the layer of UV curable material on the housing surface to thereby cure the select portions of the of the layer of UV curable material that are to remain on the outer surface housing. Optionally, the method can further remove any portions of the layer of UC curable material that have not been cured, and apply a translucent protective layer to the housing surface so as to cover at least the select portions of the layer of UV curable material that have been cured on the housing surface.

As a method for labeling a product, one embodiment can, for example, include at least: depositing a layer of UV curable material onto a surface of the product to be labeled; curing select portions of the layer of UV curable material that are desired to remain on the surface of the product; and removing from the surface of the product remaining portions of the layer of UV curable material that have not been cured by said curing.

As a method for depositing material to selected regions of an electronic device housing, one embodiment can, for example, include at least: depositing a layer of UV curable material onto a housing surface of the electronic device housing; partially curing select portions of the layer of UV curable material that are to remain on the surface housing; removing remaining portions of the layer of UV curable material that have not been partially cured by said partially curing; and completing curing of the select portions of the layer of UV curable material that were previously partially cured.

As a method for depositing material to selected regions of an electronic device housing, one embodiment can, for example, include at least: depositing a layer of UV curable material onto a housing surface of the electronic device housing; curing, using UV radiation of a first wavelength, select portions of the layer of UV curable material that are desired to remain on the surface housing; and removing, using UV radiation of a second wavelength, unselected portions of the layer of UV curable material, the second wavelength being different than the first wavelength.

As a method for depositing material to selected regions of an electronic device housing, one embodiment can, for example, include at least: depositing a layer of curable material onto a housing surface of the electronic device housing; applying a first predetermined wavelength of radiation to one or more desired portions of the curable material that are to be colored to a first color; and applying a second predetermined wavelength of radiation to one or more desired portions of the curable material that are to be colored to a second color.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF EMBODIMENTS OF THE INVENTION

The invention pertains to techniques or processes for providing markings on products. The markings provided on products can be textual and/or graphic. The techniques or processes can provide high resolution markings on surfaces that are flat or curved. In one embodiment, the products have housings and the markings are to be provided on the housings. For example, the housing for a particular product can include an outer housing surface and the markings can be provided on the outer housing surface. The products can, in one embodiment, pertain to electronic devices, such as portable electronic device (e.g., handheld electronic devices).

In general, markings, or annotations, provided on products according to the invention can be textual and/or graphic. The markings can be provided in one color or multiple colors. The marking of a product can be used to provide the product (e.g., a product's housing) with certain information. The marking can, for example, be use to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like. When a marking includes a graphic, the graphic can pertain to a logo, a certification mark, standards mark or an approval mark. The markings can be used for advertisements to be provided on products. The markings can also be used for customization (e.g., user customization) of product housings (e.g., customized external appearance via markings).

One aspect of some embodiments provides product markings using an ultra-violet (UV) curable material. Here, a UV curable material can be placed on a product surface, and then selectively cured on the product surface in places where markings, namely text and/or graphics, are to be provided. Subsequently, remaining UV curable material at the product surface that has not been cured can be removed such that the product surface thereafter includes the text and/or graphics for the product marking. The product marking process according to the invention is suitable for use on flat, curved or complex surfaces.

Embodiments of the invention are discussed below with reference to FIGS. 1-9. However, those skilled in the art will readily appreciate that the detailed description given herein with respect to these figures is for explanatory purposes as the invention extends beyond these limited embodiments.

Figure 1:
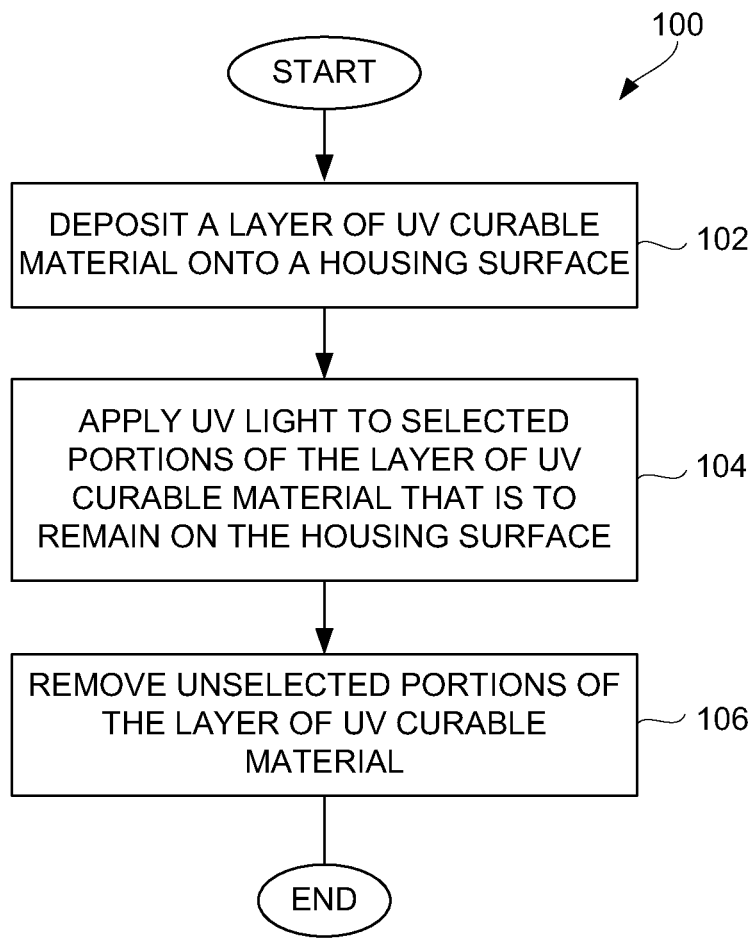
FIG. 1 is a process flow diagram for product marking process according to one embodiment of the invention.

FIG. 1 is a process flow diagram for product marking process 100 according to one embodiment of the invention. The product marking process 100 is, for example, suitable for applying text or graphics to a housing surface (e.g., an outer housing surface) of a product. For example, the product can be an electronic device. The product marking process 100 is, in one embodiment, particularly well-suited for applying text and/or graphics to an outer housing surface of a portable electronic device, such as a handheld electronic device. Examples of handheld electronic devices include mobile telephones (e.g., cell phones), Personal Digital Assistants (PDAs), portable media players, remote controllers, pointing devices (e.g., computer mouse), game controllers, etc.

Initially, the product marking process 100 deposits 102 a layer of ultra-violet (UV) curable material onto a housing surface of a product. In one embodiment, the UV curable material can be adhesive material that can be applied to the outer housing surface as an adhesive layer. The housing surface can be flat or curved. Next, a UV light can be applied 104 to selected portions of the layer of UV curable material that is to remain on the housing surface. Here, the UV light is applied 104 so as to cure the selected portions of the UV curable material. As a result, the selected portions of the UV curable material are cured and thus become firmly adhered to the housing surface. Thereafter, the unselected portions of the layer of UV curable material can be removed 106 from the housing surface. Since the unselected portions of the UV curable material have not been cured, such unselected portions have not firmly adhered to the housing surface. As a result, through use of a fluid (e.g., water, solution, dissolvent), the unselected portions of the UV curable material can be removed from the housing surface, while the selected portions of the UV curable material that have been cured can remain adhered to the housing surface.

Consequently, the product marking process 100 serves to mark the housing surface of the product through use of selected portions of the UV curable material. The markings provided by the product marking process 100 can be text and/or graphics. For example, a graphic provided by the marking might pertain to a logo, a certification mark or an approval mark. The markings can also be durable and have a high resolution.

Figure 2A:
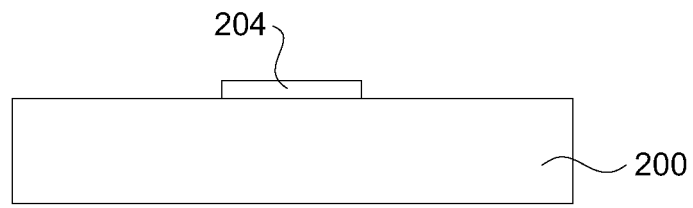
FIGS. 2A-2C are diagrams detailing a product marking process according to one embodiment of the invention.
Figure 2B:
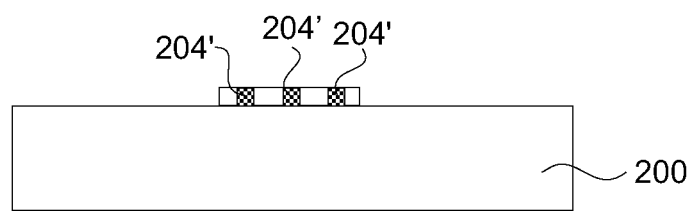
Figure 2C:
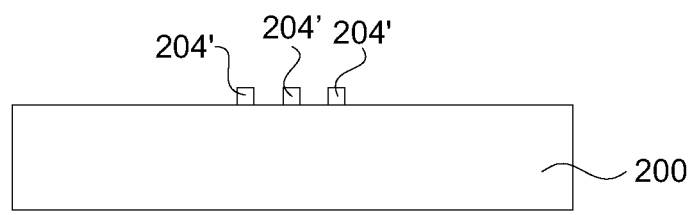

FIGS. 2A-2C are diagrams detailing a product marking process according to one embodiment of the invention. The product marking process shown in FIGS. 2A-2C pertains to one embodiment of the product marking process 100 illustrated in FIG. 1.

FIG. 2A is a diagram illustrating a housing portion 200. The housing portion 200 can represent a portion of a product housing, such as an outer housing of an electronic device. Deposited on the housing portion 200 is a layer of UV curable material 204. The layer of UV curable material 204 is a thin layer that can be deposited on a region of the housing portion 200. Through further processing the layer of UV curable material 204 is able to provide the desired product marking to the housing portion.

FIG. 2B is a diagram illustrating the housing portion 200 after selected portions of the layer of UV curable material 204 have been selectively cured. After the layer of UV curable material has been deposited on the housing portion 200, selective curing can be performed using a laser providing UV light. As shown in FIG. 2B, after the selective curing, the layer of UV curable material 204 is now converted to specific marking elements 204'. The specific marking elements 204' can pertain to text and/or graphic elements that are formed from cured portions of the layer of UV curable material 204.

FIG. 2C is a diagram illustrating the housing portion 200 after the remaining (unselected) portions of the layer of UV curable material 204 have been removed from the housing portion 200. For example, the remaining (unselected) portions of the layer of UV curable material 204 have been removed from the housing portion 200 through a rinsing operation. As shown in FIG. 2C, the specific marking elements 204' that have been formed in the layer of UV curable material 204 remain on the outer surface of the housing portion 200.

Optionally, a protective coating can be applied on the outer surface of the housing portion 200 over the specific marking elements 204' that have been formed in the layer of UV curable material 204. The protective coating can, for example, be translucent, such as clear acrylic.

Figure 3:
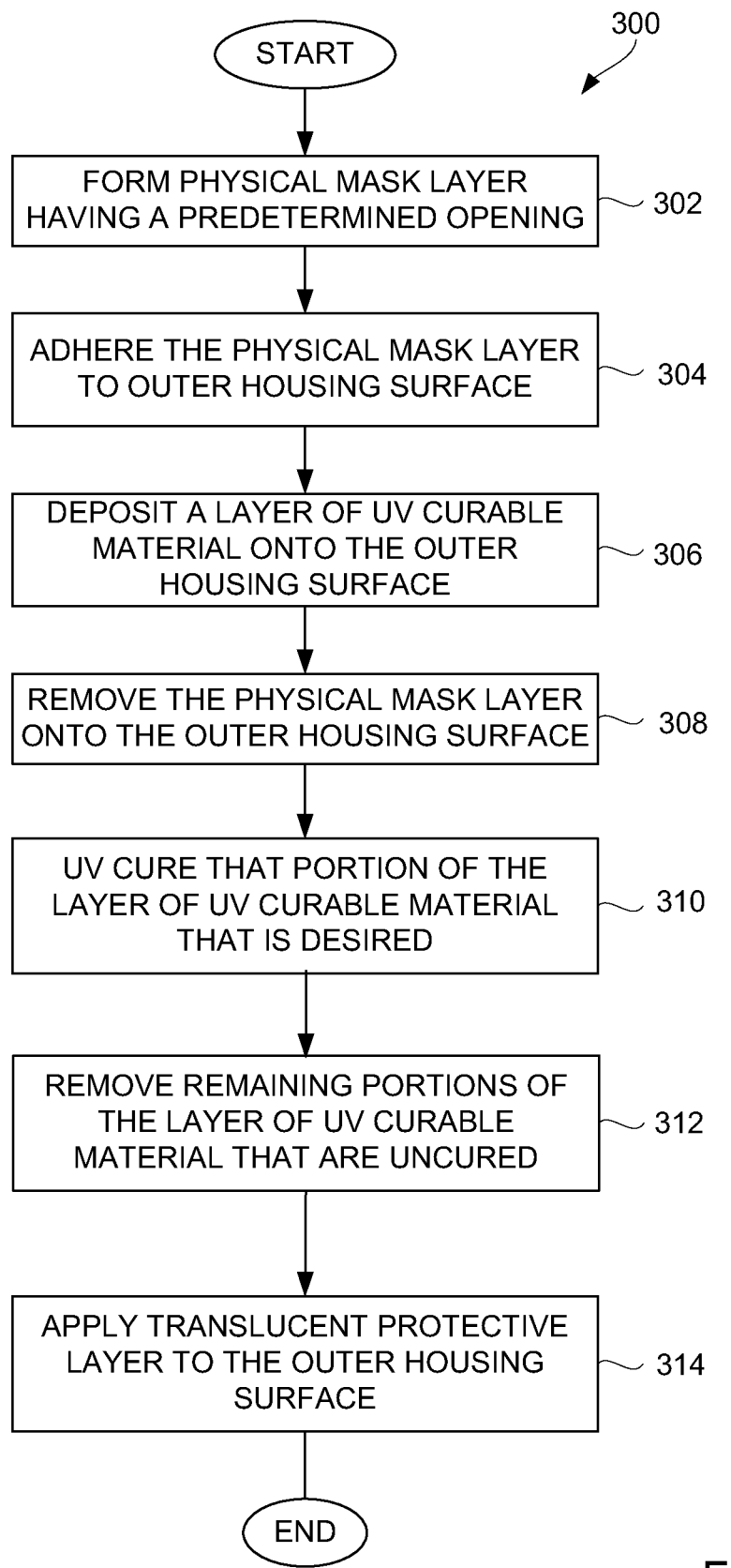
FIG. 3 is a process flow diagram for a product marking process according to another embodiment of the invention.

FIG. 3 is a process flow diagram for a product marking process 300 according to another embodiment of the invention. In this embodiment, the product marking process 300 can mark a housing of an electrical device. For example, the product marking process 300 can be used to form text and/or graphics onto a housing surface, such as an outer housing surface, of an electrical device (e.g., portable electronic device).

The product marking process 300 can initially form 302 a physical mask layer having at least one predetermined opening. The predetermined opening is, for example, an opening that surrounds a region were text or graphics is to be applied to the outer housing surface. In other words, the predetermined opening is oversized as compared to the region where text or graphic is to be applied on the outer housing surface. In one implementation, the physical mask layer can, for example, be implemented by a film having at die cut for the predetermined opening. In the event that the physical mask layer has more than one predetermined opening, the physical mask layer can have a die cut for each of the predetermined openings.

After the physical mask layer has been formed 302, the physical mask layer can be adhered 304 to the outer housing surface. In one implementation, the physical mask layer can be adhered 304 to the outer housing surface through use of an adhesive. For example, the physical mask can have an adhesive backing.

Next, a layer of UV curable material can be deposited 306 onto the outer housing surface. For example, a spray or printing technique can be used to deposit 306 a layer of UV curable material onto the outer housing surface. The layer of UV curable material being deposited 306 is the material that is to form the marking on the housing surface. For example, the layer of UV curable material can be a layer of UV curable adhesive, such as a curable coating DYMAX Multi-Cure 9-20557 available from DYMAX Corporation of Torrington, Conn. Thereafter, the physical mask layer can be removed 308 from the outer housing surface.

After the physical mask layer has been removed 308, the product marking process 300 can UV cure 310 that portion of the layer of UV curable material that is desired to form the marking. The UV cure 310 can utilize a laser to precisely cure portions of the layer of UV curable material that has been deposited 306 onto the outer housing surface. The UV cure 310 can thus form specific graphical elements and/or text elements from the layer of UV curable material by UV cure 310 of those portions of the layer of material that are used to represent the desired graphical elements and/or textual elements that are to remain on the outer housing surface. In one implementation, the laser performing the UV cure 310 is a marking laser that produces ultra-violent light (e.g., 355 nanometer (NM) laser). Although various different lasers can be used, one supplier for making lasers is TRUMPF Inc. of Farmington, Conn. Through proper control of the laser, the UV cure 310 of desired portions of the layer of UV curable material can be selectively performed without damage to the surface of the outer surface housing.

After the UV cure 310 has been performed, those remaining portions of the layer of UV curable material that are uncured can be removed 312 from the outer housing surface. Hence, the portions of the layer of UV curable material that have been UV cured remain adhered to the outer housing surface, while those other portions that have not been UV cured are removed. A fluid can be use to rinse off the remaining portions of the layer of UV curable material that are uncured. The fluid can, for example, be water and/or a dissolvent (e.g., isopropyl alcohol).

Subsequently, a translucent protective layer can be applied 314 to the outer housing surface. Although the translucent protective layer is not required, the translucent protective layer can serve to protect the portion of the layer of UV curable material that is used to represent the one or more desired graphical elements and/or textual elements on the outer housing surface. For example, the translucent protective layer can be a layer of acrylic. After the translucent protective layer has been applied 314, the product marking process 300 can end.

It should be noted that the use of a physical mask in the product marking process 300 is optional. The physical mask serves to confine the area(s) where the layer of UV curable material is provided. Hence, in one embodiment, the product marking can be performed with simply operations 306, 310 and 312 of the product marking process 300.

FIGS. 4A-4F are diagrams detailing a product marking process according to one embodiment of the invention. The product marking process shown in FIGS. 4A-4F pertain to one embodiment of the product marking process 300 illustrated in FIG. 3.

Figure 4A:
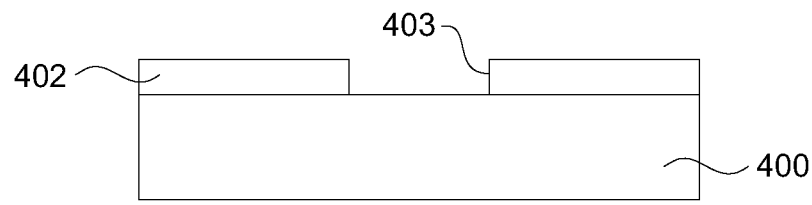
FIGS. 4A-4F are diagrams detailing a product marking process according to one embodiment of the invention.

FIG. 4A is a diagram illustrating a housing portion 400. The housing portion 400 can represent a portion of a product housing, such as an outer housing of an electronic device. A mask layer 402 is attached to the housing portion 400. The mask layer 402 has at least one predetermined opening 403 that defines a region where marking of the outer housing is to be performed.

Figure 4B:
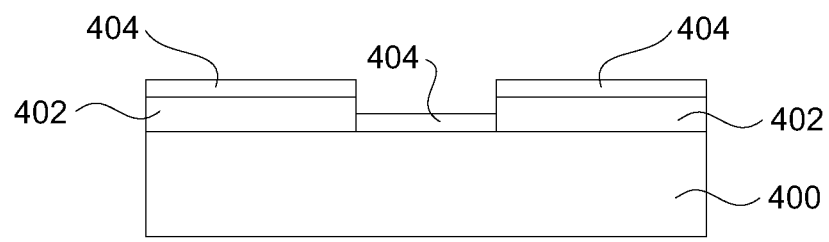

FIG. 4B is a diagram illustrating the housing portion 400 having the mask layer 402 as well as a layer of material 404. The layer of material 404 is applied over the predetermined opening 403 in the mask layer 402 and may also be applied over some or all of the mask layer 402. In one implementation, the material of the layer of UV curable material 404 is, for example, a thin layer of UV-curable adhesive. The layer of UV curable material can be applied is a spray-on liquid.

Figure 4C:
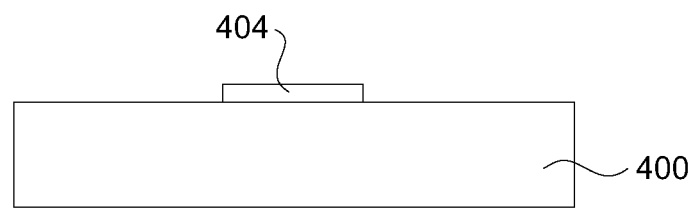

FIG. 4C is a diagram illustrating the housing portion 400 having a remaining portion of the layer of material 404 that results after the mask layer 402 is removed from the housing portion 400. The remaining portion of the layer of UV curable material 404 corresponds to the at least one predetermined opening 403 in the mask layer 402.

Figure 4D:
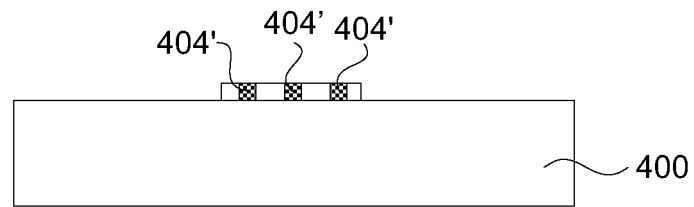

FIG. 4D is a diagram illustrating the housing portion 400 after selected portions of the layer of UV curable material 404 have been selectively cured. The selective curing can be performed using a laser providing UV light. The laser can have a small spot size (e.g., 10-30 microns) of the UV light to provide high resolution. As shown in FIG. 4D, after the selective curing, the layer of UV curable material 404 is now converted to specific marking elements 404'. The specific marking elements 404' can pertain to text and/or graphic elements that are formed from cured portions of the layer of UV curable material 404.

Figure 4E:
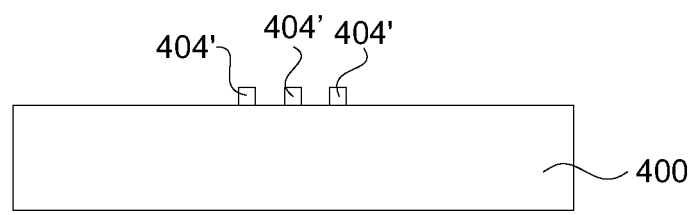

FIG. 4E is a diagram illustrating the housing portion 400 after the remaining (unselected) portions of the layer of UV curable material 404 have been removed from the housing portion 400. For example, the remaining (unselected) portions of the layer of UV curable material 404 have been removed from the housing portion 400 through a rinsing operation. The specific marking elements 404' that have been formed in the layer of UV curable material 404 remain on the outer surface of the housing portion 400.

Figure 4F:
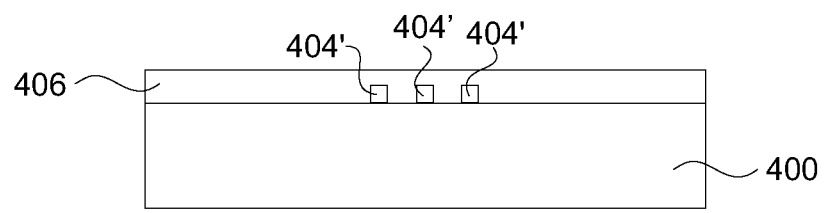

FIG. 4F is a diagram illustrating the housing portion 400 after a protective coating 406 is applied on the outer surface of the housing portion 400 over the specific marking elements 404' that have been formed in the layer of UV curable material 404.

Although embodiment discussed above can operate to selectively curing UV curable material using a laser providing UV light, it should be noted that UV light for curing can be provided by other UV light sources. Additionally, in some embodiments, deposited UV curable material can be cured using multiple different UV light sources. For example, a wide UV light source (e.g., flood light) can be used to cure a large area, while for small marking features a narrow UV light source (e.g., UV laser) can be used.

Figure 5A:
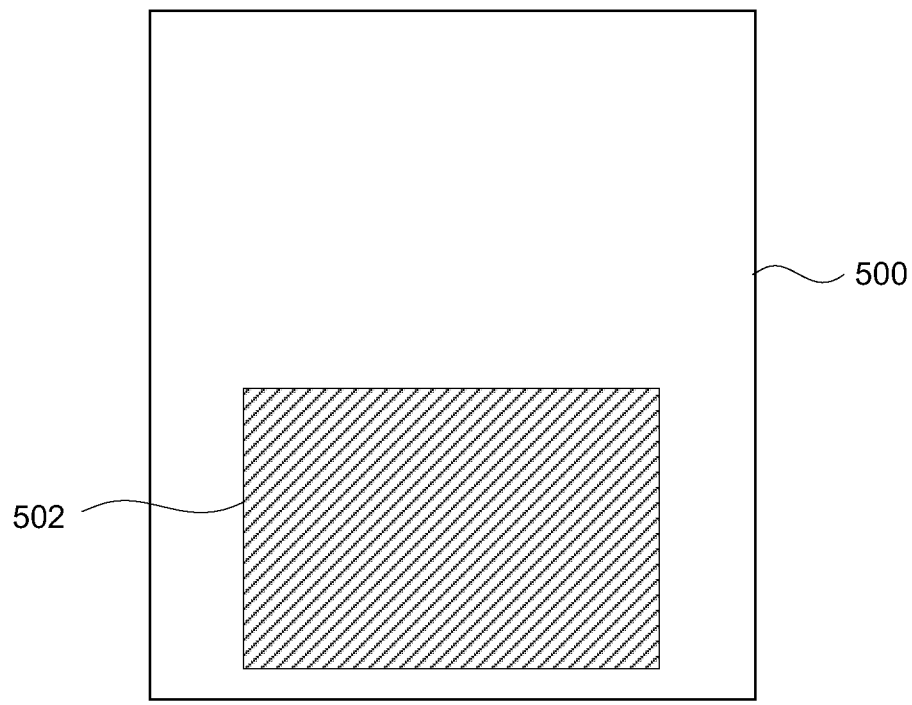
FIGS. 5A and 5B are diagrams illustrating exemplary marking of a product in accordance with a product marking process.
Figure 5B:
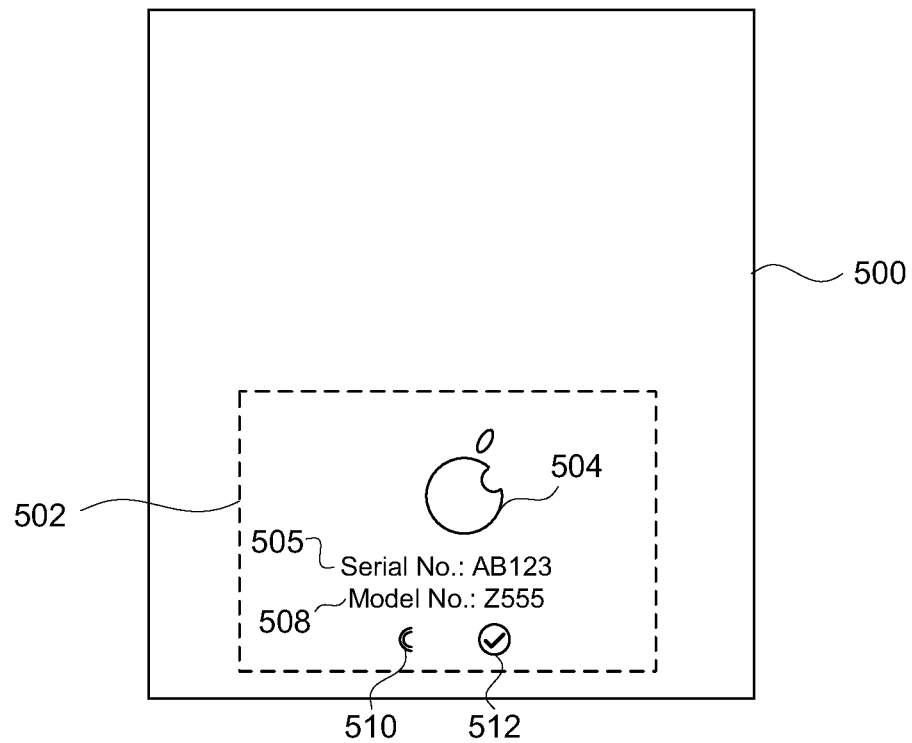

FIGS. 5A and 5B are diagrams illustrating exemplary marking of a product in accordance with a product marking process, such as the product marking process shown in FIGS. 4A-4F of the product marking process 400 illustrated in FIG. 4.

FIG. 5A illustrates a product housing 500 according to one embodiment. The product housing 500 being illustrated can represent one surface, such as back surface, of a handheld electronic device. A predetermined region 502 of the illustrated surface can be coated or covered with a layer of material to be used for marking (e.g., UV curable material). As noted above, a masking layer can be used to confine the layer of material to the predetermined region 502.

FIG. 5B illustrates the product housing 500 after the layer of material in the predetermined region 502 has been further processed (e.g., curing and rinsing) to yield the desired labeling. In this example, the labeling includes a logo graphic 504, serial number 506, model number 508, and certification/approval marks 510 and 512.

Although UV curing is primarily discussed above, other curing can be performing. For example, infrared (IR) light can be used to cure an IR curable material in much the same manner that an IT curable material is cured by UV light. IR curing uses heat generated by IR light to cure the IR curing material. An IR laser can produce the IR light. Through process control (e.g., pulse-width, intensity, etc.), the amount of IR light being deposed can be controlled. Further, in one embodiment, curing can be provided by a combination of UV curing and IR curing. For example, a laser source could output either or both of UV light and IR light. With both UV and IR light sources, the curing may be efficiently performed by controlling not only UV light but also IR light so that the curing material can be heated as appropriate while being US cured.

In some embodiments it may be desirable to use ablation to at least partially form the product marking. For example, in one embodiment, at least a portion of the cured UV curable material that has been cured on a product surface can be further ablated (e.g., using a laser). The ablation can, for example, be used to assist in forming detailed and precise text and/or graphics for the product marketing. Additional details on using ablation for forming product marking are provided in U.S. Provisional Patent Application No. 61/121,491 which is incorporated herein by reference below.

In another embodiment, a material (e.g., UV ink) can be configured to be specifically sensitive to UV radiation. In one example, the material can be sensitive to the UV radiation such that the material can be partially cured. Then, after being partially cured, the material that has not been partially cured can be cleaned from the surface. Subsequently, the remaining partially-cured material can be completely cured.

Figure 6:
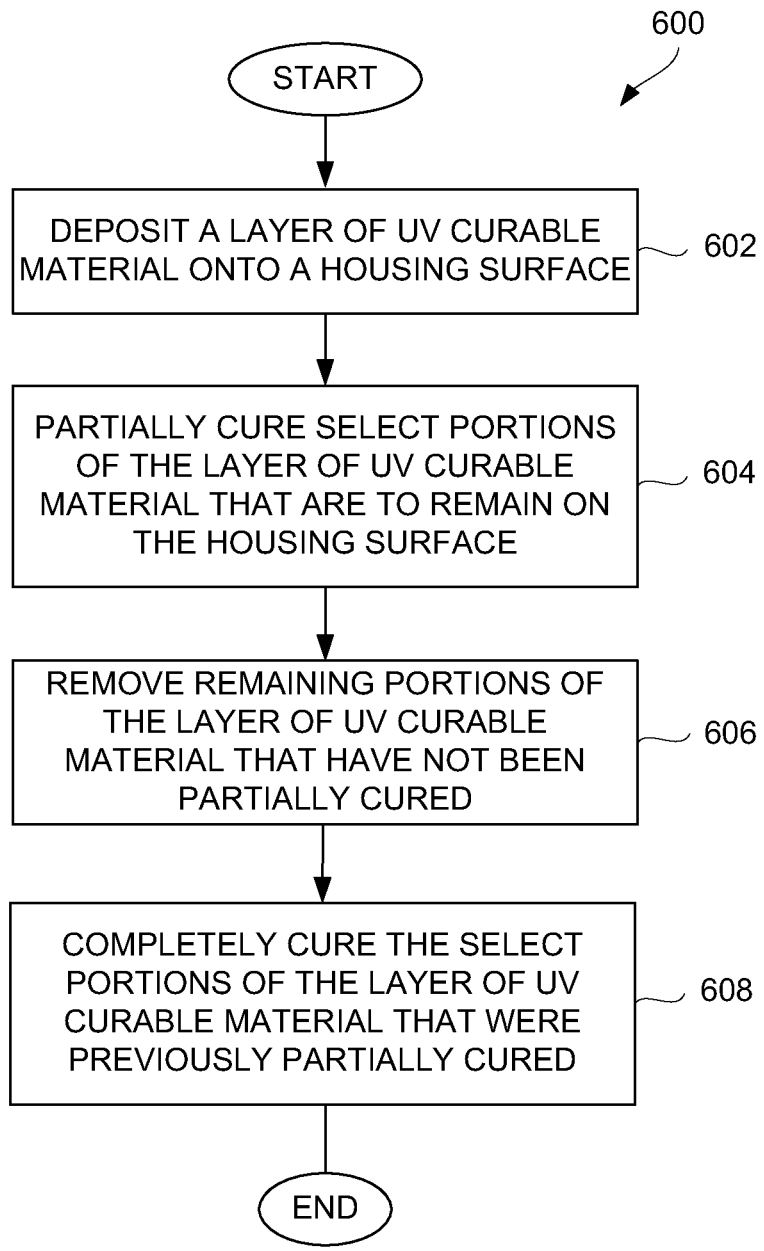
FIG. 6 is a process flow diagram for product marking process 600 according to another embodiment of the invention.

FIG. 6 is a process flow diagram for product marking process 600 according to one embodiment of the invention. The product marking process 600 is, for example, suitable for applying text or graphics to a housing surface (e.g., an outer housing surface) of a product. For example, the product can be an electronic device. The product marking process 600 is, in one embodiment, particularly well-suited for applying text and/or graphics to an outer housing surface of a portable electronic device, such as a handheld electronic device. Examples of handheld electronic devices include mobile telephones (e.g., cell phones), Personal Digital Assistants (PDAs), portable media players, remote controllers, pointing devices (e.g., computer mouse), game controllers, etc.

Initially, the product marking process 600 deposits 602 a layer of ultra-violet (UV) curable material onto a housing surface of a product. In one embodiment, the UV curable material can be adhesive material that can be applied to the outer housing surface as an adhesive layer. The housing surface can be flat or curved.

Next, selected portions of the layer of UV curable material that are to remain on the housing surface can be partially cured 604. As a result, the selected portions of the UV curable material that are partially cured are not fully cured but are sufficiently cured to adhere to the housing surface. Here, in one implementation, UV light can be applied so as to partially cure the selected portions of the UV curable material. The UV light can be induced in a controlled manner, such as with a UV laser, to partially cure the selected portions of the UV curable material.

The remaining portions of the layer of UV curable material that have not been partially cured can be removed 606 from the housing surface. Since the remaining portions (i.e., unselected portions) of the UV curable material have not been cured, such remaining have not been cured enough to significantly adhere to the housing surface. As a result, through use of a fluid (e.g., water, solution, dissolvent), the remaining portions of the UV curable material can be removed from the housing surface, while the selected portions of the UV curable material that have been partially cured are able to remain adhered to the housing surface.

Thereafter, the selected portions of the layer of UV curable material that were previously partially cured and that are to remain on the housing surface can be completely cured 608. As a result, the selected portions of the UV curable material that were previously partially cured are now fully cured and firmly adhered to the housing surface. Here, in one implementation, UV light can be applied so as to complete the curing of the selected portions of the UV curable material. The UV light can be induced in a bulk manner, such as with a UV lamp, to complete the curing of the selected portions, i.e., the remaining portions, of the UV curable material.

Consequently, the product marking process 600 serves to mark the housing surface of the product through use of selected portions of the UV curable material. The markings provided by the product marking process 600 can be text and/or graphics. For example, a graphic provided by the marking might pertain to a logo, a certification mark or an approval mark. The markings can also be durable and have a high resolution.

FIGS. 7A-7D are diagrams detailing a product marking process according to one embodiment of the invention. The product marking process shown in FIGS. 7A-7D pertains to one embodiment of the product marking process 600 illustrated in FIG. 6.

Figure 7A:
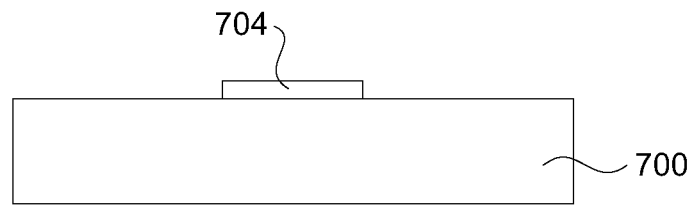
FIGS. 7A-7D are diagrams detailing a product marking process according to one embodiment of the invention.

FIG. 7A is a diagram illustrating a housing portion 700. The housing portion 700 can represent a portion of a product housing, such as an outer housing of an electronic device. Deposited on the housing portion 700 is a layer of UV curable material 704. The layer of UV curable material 704 is a thin layer that can be deposited on a region of the housing portion 200. Through further processing, the layer of UV curable material 704 is able to provide the desired product marking to the housing portion.

Figure 7B:
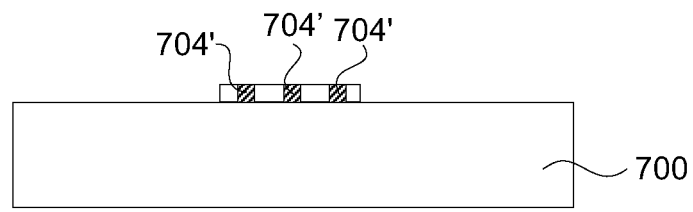

FIG. 7B is a diagram illustrating the housing portion 700 after selected portions of the layer of UV curable material 704 have been selectively cured. After the layer of UV curable material has been deposited on the housing portion 700, selective curing can be performed using a laser providing UV light. As shown in FIG. 7B, after the selective curing, the layer of UV curable material 704 is now converted to specific marking elements 704'. The specific marking elements 704' can pertain to text and/or graphic elements that are formed from cured portions of the layer of UV curable material 704.

Figure 7C:
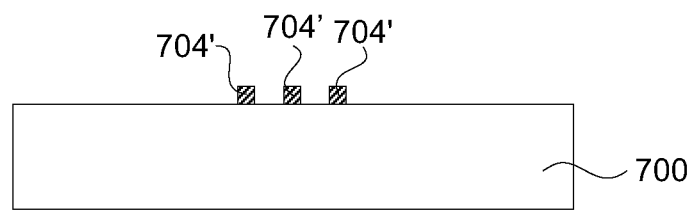

FIG. 7C is a diagram illustrating the housing portion 700 after the remaining (unselected) portions of the layer of UV curable material 704 have been removed from the housing portion 700. For example, the remaining (unselected) portions of the layer of UV curable material 704 have been removed from the housing portion 700 through a rinsing operation. As shown in FIG. 7C, the specific marking elements 704' that have been formed in the layer of UV curable material 704 remain on the outer surface of the housing portion 700.

Figure 7D:
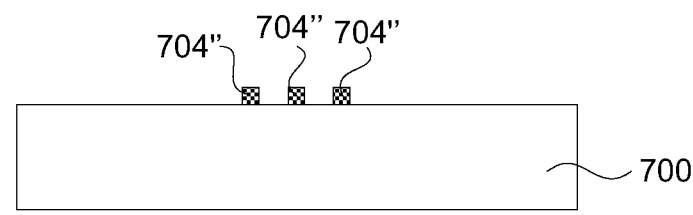

FIG. 7D is a diagram illustrating the housing portion 700 after the selected portions of the layer of UV curable material 704 have been completely cured. For example, the specific marking elements 704' that have been formed in the layer of UV curable material 704 on the outer surface of the housing portion 700 and that have previously been partially cured can be completely cured. Once completely cured, the specific marking elements 704' can become completely cured specific marking elements 704". The completion of the curing can be performed using a UV energy source, such as a UV lamp. The completely cured specific marking elements 704" can pertain to text and/or graphic elements that are formed from cured portions of the layer of UV curable material 704.

Optionally, a protective coating can be applied on the outer surface of the housing portion 700 over the completely cured specific marking elements 704" that have been formed in the layer of UV curable material 704. The protective coating can, for example, be translucent, such as clear acrylic.

In another embodiment, a marking material, such as UV ink, can be configured to be specifically sensitive to multiple different wavelengths of UV radiation. In one example, the marking material can be configured to be sensitive to radiation, such as UV radiation, of a first wavelength and a second wavelength. For example, in a first pass, a UV laser applying UV radiation of a first wavelength can be used to cure selective portions of the marking material, and then, in a second pass, a laser can apply radiation to ablate away undesired portions of the marking material.

Figure 8:
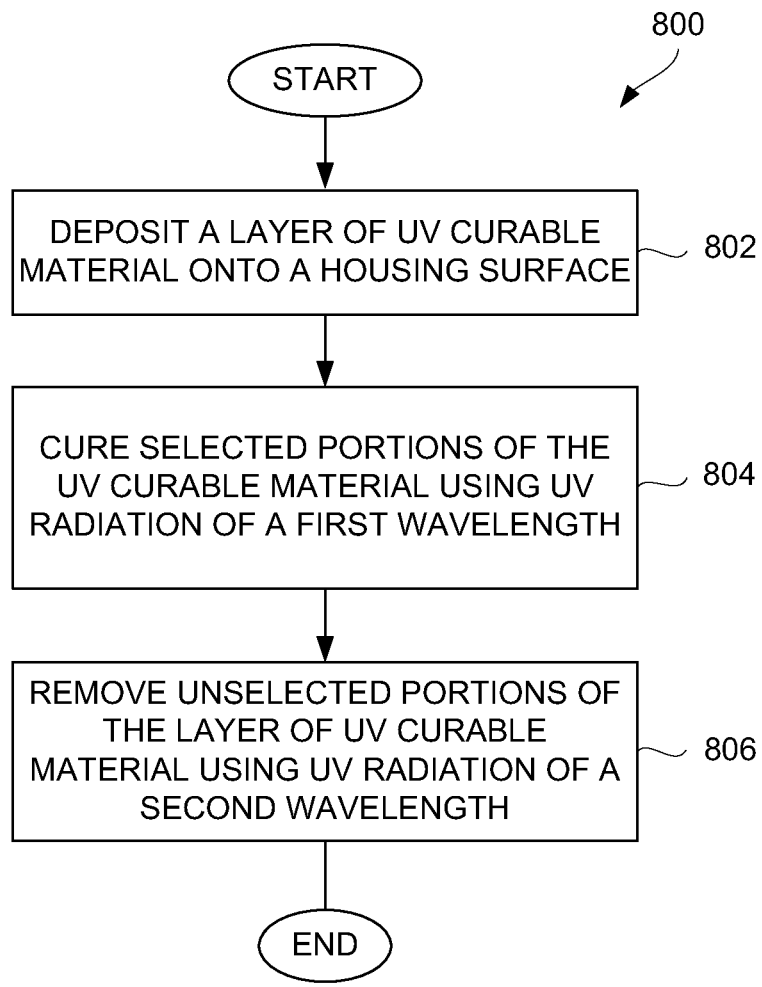
FIG. 8 is a process flow diagram for product marking process 800 according to another embodiment of the invention.

FIG. 8 is a process flow diagram for product marking process 800 according to one embodiment of the invention. The product marking process 800 is, for example, suitable for applying text or graphics to a housing surface (e.g., an outer housing surface) of a product. For example, the product can be an electronic device. The product marking process 800 is, in one embodiment, particularly well-suited for applying text and/or graphics to an outer housing surface of a portable electronic device, such as a handheld electronic device. Examples of handheld electronic devices include mobile telephones (e.g., cell phones), Personal Digital Assistants (PDAs), portable media players, remote controllers, pointing devices (e.g., computer mouse), game controllers, etc.

Initially, the product marking process 800 deposits 802 a layer of ultra-violet (UV) curable material onto a housing surface of a product. In one embodiment, the UV curable material can be adhesive material that can be applied to the housing surface. The housing surface can be flat or curved.

Next, selected portions of the UV curable material can be selectively cured 804 using UV radiation of a first wavelength. The selected portions of the UV curable material that are those portions of the UV curable material that are to remain on the housing surface. The UV curable material can be configured to be sensitive to radiation, such as UV radiation, of the first wavelength. As an example, the UV radiation for curing can be applied by a UV laser which selectively provides controlled UV radiation of the first wavelength. Hence, the selective application of radiation causes the selected portion of the UV curable material to be cured and thus become firmly adhered to the housing surface.

Thereafter, unselected portions of the layer of UV curable material (i.e., those portions that have not been cured) can be removed 806 from the housing surface using UV radiation of a second wavelength. For example, the selective application of UV radiation of the second wavelength can cause the unselected portions of the UV curable material to be ablated away from the housing surface. As an example, the UV radiation for ablation can be applied by a UV laser which selectively provides controlled UV radiation of the second wavelength.

Consequently, the product marking process 800 serves to mark the housing surface of the product through use of selected portions of the UV curable material. The markings provided by the product marking process 800 can be text and/or graphics. For example, a graphic provided by the marking might pertain to a logo, a certification mark or an approval mark. The markings can also be durable and have a high resolution.

The product marking process shown in FIGS. 2A-2C can also pertain to one embodiment of the product marking process 800 illustrated in FIG. 8. In this embodiment, the UV curable material 204 can be configured to be sensitive to radiation, such as UV radiation, of the first wavelength for curing of the specific marking elements 204'. The UV radiation of the first wavelength can be provided by a laser. Also, the UV curable material 204 can be configured to be sensitive to radiation, such as UV radiation, of the second wavelength for ablation of the UV curable material 204 other than the specific marking elements 204'. The UV radiation of the second wavelength can be provided by a laser.

Optionally, the product marking process 800 can have a protective coating applied on the outer surface of the housing portion 200 over the specific marking elements 204' that have been formed in the layer of UV curable material 204. The protective coating can, for example, be translucent, such as clear acrylic.

In still another embodiment, a marking material can be placed on a surface and configured to selected change color under laser control. The marking material, such as ink, can include one or more initiators. For example, the initiators can be dye additives (e.g., micro dye capsules embedded in the marking material. The one or more initiators in the marking material can serve as color activators. Laser energy can then be selectively applied to initiate colorization of the marking material (e.g., by activating, breaking or bursting the micro dye capsules). Different initiators can be receptive to different wavelength of laser energy such that different colors can be produced using different wavelengths. The colorization can be induced before, during or after cure of the marking material.

Figure 9:
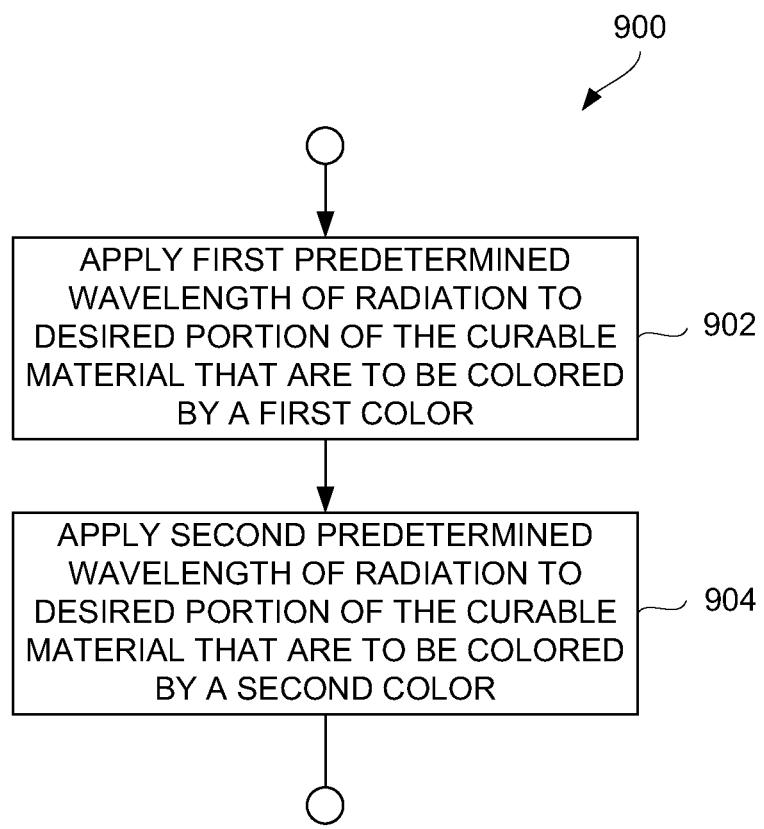
FIG. 9 is a process flow diagram for color marking process 900 according to one embodiment of the invention.

FIG. 9 is a process flow diagram for color marking process 900 according to one embodiment of the invention. The color marking process 900 is, for example, suitable for applying colored text or graphics to a housing surface (e.g., an housing surface) of a product. The colored marking process 900 can, for example, be used with any of the product marking processes 100, 300, 600 or 800 discussed above. Also depending on implementation, the color marking process 900 can be performed before, during or after cure or partial cure of the marking material that is process to induce one or more colors.

According to the color marking process 900, a first predetermined wavelength of radiation can be applied 902 to desired portions of curable material that are to be colored by a first color. These desired portions are also portions of the curable material that are to remain on the housing surface. The curable material, such as UV curable material, can be configured to include color activators of the first color that are sensitive to radiation, such as UV radiation, of the first predetermined wavelength. As an example, the UV radiation for activating the first color can be applied by a UV laser which selectively provides controlled UV radiation of the first predetermined wavelength that serves to activate the first color (e.g., by breaking or bursting micro dye capsules or otherwise releasing dye from the micro dye capsules). Hence, the controlled application of radiation of the first predetermined wavelength causes color initiators in the curable material to be activated to release color so as to colorize the desired portions with the first color.

In addition, a second predetermined wavelength of radiation can be applied 904 to desired portions of curable material that are to be colored by a second color. These desired portions are also portions of the curable material that are to remain on the housing surface. The curable material, such as UV curable material, can be configured to include color activators of the second color that are sensitive to radiation, such as UV radiation, of the second predetermined wavelength. As an example, the UV radiation for activating the second color can be applied by a UV laser which selectively provides controlled UV radiation of the second predetermined wavelength that serves to activate the second color (e.g., by breaking or bursting micro dye capsules or otherwise releasing dye from the micro dye capsules). Hence, the controlled application of radiation of the second predetermined wavelength causes color initiators in the curable material to be activated to release color so as to colorize the desired portions with the second color.

Optionally, the curable material can be configured to include color activators of one or more additional colors that are sensitive to radiation, such as UV radiation, of additional predetermined wavelengths. The controlled application of radiation of the additional predetermined wavelengths can cause various color initiators in the curable material to be activated to release color so as to colorize the desired portions with the additional color. It should be noted that two or more colors can be mixed if activated at the same region in the curable material.

In one embodiment, the product marking techniques discussed herein can be used to provide markings on a portable electronic device. The portable electronic device can further be a handheld electronic device. The term handheld generally means that the electronic device has a form factor that is small enough to be comfortably held in one hand. Typically, a handheld electronic device is less than one (1) pound in weight. A hand-held electronic device may be directed at one-handed operation or two-handed operation. In one-handed operation, a single hand is used to both support the device as well as to perform operations with the user interface during use. In two-handed operation, one hand is used to support the device while the other hand performs operations with a user interface during use or alternatively both hands support the device as well as perform operations during use. In some cases, the hand-held electronic device is sized for placement into a pocket of the user. By being pocket-sized, the user does not have to directly carry the device and therefore the device can be taken almost anywhere the user travels (e.g., the user is not limited by carrying a large, bulky and often heavy device).

This application references or incorporates: (i) U.S. Provisional Patent Application No. 61/059,789, filed Jun. 8, 2008, and entitled "Methods and Systems for Manufacturing an Electronic Device," which is hereby incorporated herein by reference; and (ii) U.S. Provisional Patent Application No. 61/121,491, filed Dec. 10, 2008, and entitled "Techniques for Marking Product Housings," which is hereby incorporated herein by reference.

The various aspects, features, embodiments or implementations of the invention described above can be used alone or in various combinations.

Aspects, embodiments or implementations described herein may provide high precision marking for product housings. As an example, the marking being provided can have a resolution whereby thirty (30) micron line widths can be achieved. Aspects, embodiments or implementations described herein may provide marking techniques effective for surfaces that are flat or curved. Aspects, embodiments or implementations described herein may also provide marking techniques having good adhesion characteristics to product housings, such as plastic housings. Aspects, embodiments or implementations described herein may provide one or several markings to one or more distinct areas of a product's housing. The various markings can be efficiently provided in a sequential or concurrent manner. The various marking can also use a single color or a plurality of colors. In some embodiments, if multiple colors are to be used in the markings, the processing can be repeated for each of the colors to be provided.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method for depositing material to selected regions of an electronic device housing, said method comprising:
    depositing a layer of UV curable material onto a housing surface of the electronic device housing;
    partially curing select portions of the layer of UV curable material that are to remain on the surface housing;
    removing remaining portions of the layer of UV curable material that have not been partially cured by said partially curing; and
    completing curing of the select portions of the layer of UV curable material that were previously partially cured.

2. A method as recited in claim 1, wherein said method further comprises:
    subsequently applying a translucent protective layer to the housing surface so as to cover at least the select portions of the layer of UV curable material that have been cured on the outer surface housing.

3. A method as recited in claim 1, wherein said partially curing of the select portions of the layer of material comprises directing UV light from a UV laser onto the select portions of the layer of UV curable material on the housing surface to thereby partially cure the select portions of the of the layer of UV curable material that are to remain on the outer surface housing.

4. A method as recited in claim 1, wherein the select portions of the layer of UV curable material retained on the housing surface include text and graphics.

5. A method as recited in claim 1, wherein the select portions of the layer of UV curable material retained on the housing surface include at least one graphic, the at least one graphic being a logo, a certification mark or an approval mark.

6. A method as recited in claim 1, wherein the layer of material is a layer of UV curable adhesive.

7. A method as recited in claim 1, wherein said depositing the layer of UV curable material onto the housing surface comprises spraying the layer of UV curable material onto the housing surface.

8. A method as recited in claim 1, wherein the electronic device housing is a handheld electronic device.

9. A method as recited in claim 1, wherein the housing surface is an outer housing surface.

10. A method as recited in claim 1, wherein the color of the UV curable material can be controlled using a dye additive.

11. A method as recited in claim 1, wherein the partially curing is performed using a laser.

12. A method as recited in claim 1, wherein the completing curing is performed using a UV light.

13. A method as recited in claim 1,
    wherein said partially curing of the select portions of the layer of material comprises directing UV light from a UV laser onto the select portions of the layer of UV curable material on the housing surface to thereby partially cure the select portions of the of the layer of UV curable material that are to remain on the outer surface housing, and
    wherein said method further comprises:
        subsequently applying a translucent protective layer to the housing surface so as to cover at least the select portions of the layer of UV curable material that have been completely cured on the surface housing.

14. A method for depositing material to selected regions of an electronic device housing, said method comprising:
    depositing a layer of UV curable material onto a housing surface of the electronic device housing;
    curing, using UV radiation of a first wavelength, select portions of the layer of UV curable material that are desired to remain on the surface housing; and
    removing, using UV radiation of a second wavelength, unselected portions of the layer of UV curable material, the second wavelength being different than the first wavelength.

15. A method as recited in claim 14, wherein said curing comprises:
applying a first predetermined wavelength of radiation to one or more desired portions of the curable material that are to be colored to a first color; and
applying a second predetermined wavelength of radiation to one or more desired portions of the curable material that are to be colored to a second color.

16. A method as recited in claim 15, wherein said method further comprises:
subsequently applying a translucent protective layer to the housing surface so as to cover at least the select portions of the layer of curable material that have been cured on the surface housing.

17. A method as recited in claim 15, wherein said curing of the select portions of the layer of curable material comprises directing light from a first UV laser onto the select portions of the layer of curable material on the housing surface to thereby cure the select portions of the of the layer of curable material that are to remain on the surface housing.

18. A method as recited in claim 14, wherein said curing of the select portions of the layer of UV curable material comprises directing UV light of the first wavelength from a first UV laser onto the select portions of the layer of UV curable material on the housing surface to thereby cure the select portions of the of the layer of UV curable material that are to remain on the surface housing.

19. A method as recited in claim 18, wherein said removing of the unselected portions of the layer of UV curable material comprises directing UV light of the second wavelength from a second UV laser onto the unselected portions of the layer of UV curable material on the housing surface to thereby remove the cured select portions of the of the layer of UV curable material the surface housing.

20. A method as recited in claim 14, wherein said removing of the unselected portions of the layer of UV curable material comprises ablating the unselected portions of the layer of UV curable material.

21. A method as recited in claim 20, wherein the ablating is performed by a laser operating at about the second wavelength.

22. A method as recited in claim 14, wherein said method further comprises:
subsequently applying a translucent protective layer to the housing surface so as to cover at least the select portions of the layer of UV curable material that have been cured on the surface housing.

23. A method as recited in claim 14, wherein said removing of the unselected portions of the layer of UV curable material comprises directing UV light of the second wavelength from a laser onto the unselected portions of the layer of UV curable material on the housing surface to thereby remove the cured select portions of the of the layer of UV curable from the surface housing.

* * * * *